(12) United States Patent
Mo

(10) Patent No.: US 8,109,653 B2
(45) Date of Patent: Feb. 7, 2012

(54) LED LAMP WITH LARGE LIGHT EMITTING ANGLE

(75) Inventor: Ci-Jin Mo, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 328 days.

(21) Appl. No.: 12/569,862

(22) Filed: Sep. 29, 2009

(65) Prior Publication Data

US 2010/0328948 A1    Dec. 30, 2010

(30) Foreign Application Priority Data

Jun. 29, 2009  (CN) .......................... 2009 1 0303830

(51) Int. Cl.
*F21S 4/00* (2006.01)
*F21V 21/00* (2006.01)
(52) U.S. Cl. ................... 362/249.02; 362/294; 362/545; 362/800

(58) Field of Classification Search ............. 362/249.02, 362/294, 545, 800
See application file for complete search history.

(56) References Cited

U.S. PATENT DOCUMENTS 6,648,495 B1 * 11/2003 Hsu .............................. 362/545
2011/0026253 A1 * 2/2011 Gill .......................... 362/249.02

* cited by examiner

*Primary Examiner* — Jason Moon Han
(74) *Attorney, Agent, or Firm* — Altis Law Group, Inc.

(57) ABSTRACT

An LED lamp includes a heat sink, a bracket, a plurality of LED modules. The heat sink includes a supporting plate and a plurality of fins extending upwardly from a first surface of the supporting plate. The bracket is mounted on a second surface of the supporting plate and includes a plurality of bottom plates each angled an acute angle relative to the second surface of the supporting plate. The bottom plates are arranged radially from a central portion of the supporting plate. Each of the bottom plates includes an outer surface facing downwardly and outwardly away from the second surface of the supporting plate. The LED modules are mounted on the outer surfaces of the bottom plates, respectively.

14 Claims, 5 Drawing Sheets

LED LAMP WITH LARGE LIGHT EMITTING ANGLE

BACKGROUND

1. Technical Field

The disclosure relates to illumination devices, and particularly to an LED (light emitting diode) lamp with a large light emitting angle.

2. Description of Related Art

The technology of light emitting diodes (LEDs) has been rapidly developed in recent years, allowing expansion of application from indicators to illuminators. With the features of long-term reliability, environment friendliness and lower power consumption, the LED is viewed as a promising alternative for recent light products.

A conventional LED lamp comprises a heat sink and a plurality of LEDs attached to an outer surface of the heat sink to dissipate heat generated by the LEDs. The outer surface of the heat sink is generally planar with the LEDs arranged closely. It is known that a majority of light emitted from LEDs travels in a direction approximately perpendicular to a chip surface thereof. Therefore, such LEDs mounting on the planar outer surface of the heat sink provide only a planar light source, and just provide a narrow illumination area. Therefore, the LEDs need to be arranged in a way such that the lights emitted from different LEDs can cooperatively provide a sufficiently wide illumination area to function as a three-dimensional light source.

It is thus desirable to provide an LED lamp which can satisfy the requirement of wide range illumination.

DETAILED DESCRIPTION

Figure 1:
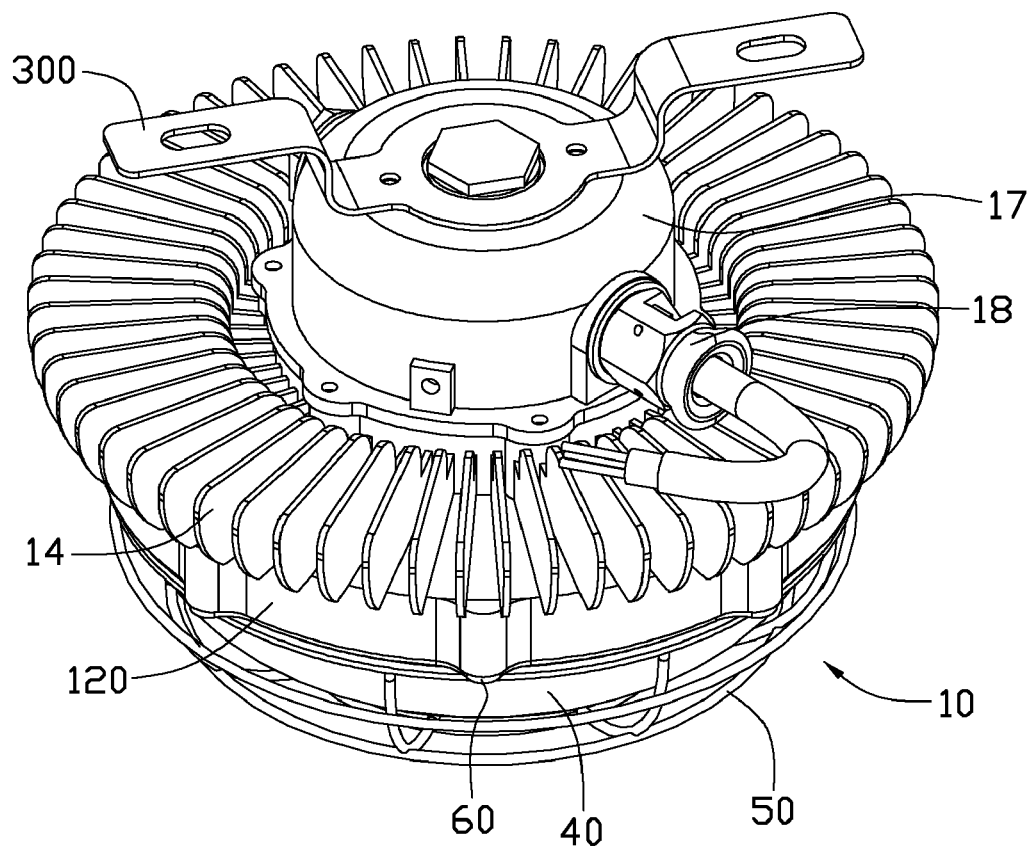
FIG. 1 is an isometric, assembled view of a light emitting diode lamp according to an exemplary embodiment.

Reference will now be made to the drawing figures to describe the present light emitting diode lamp in detail.

Figure 2:
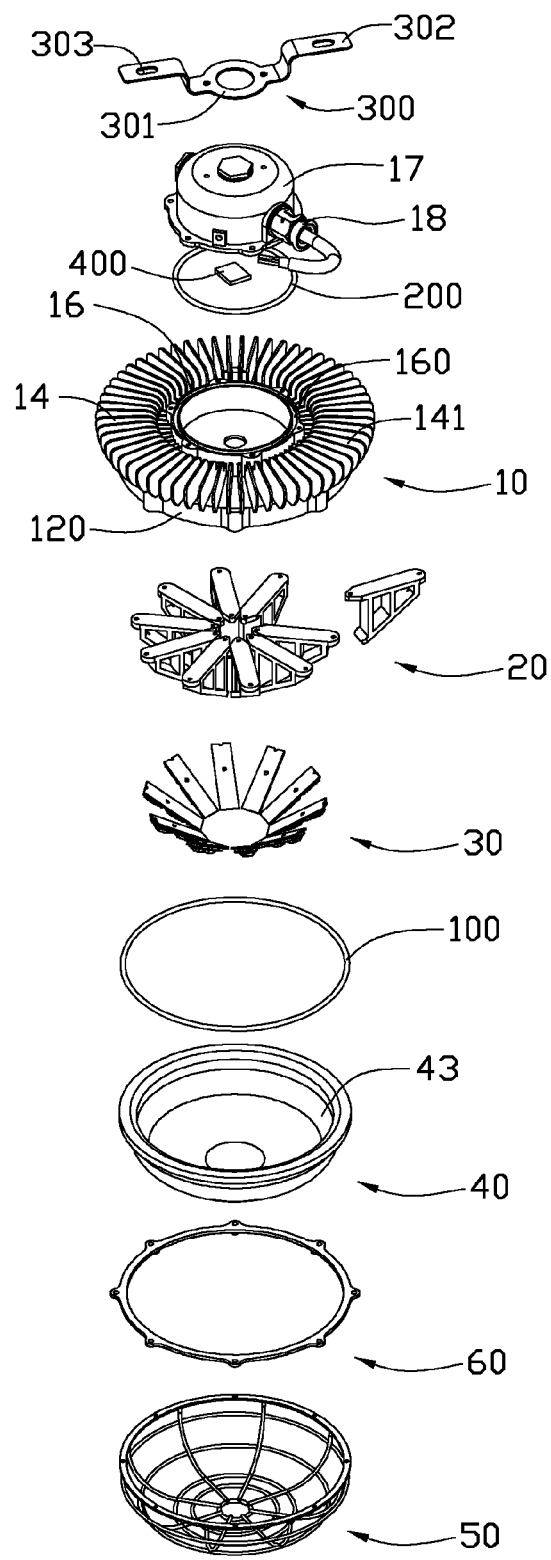
FIG. 2 is an exploded view of the light emitting diode lamp of FIG. 1.

FIGS. 1 and 2 illustrate a light emitting diode (LED) lamp in accordance with an exemplary embodiment of the disclosure. The LED lamp includes a heat sink 10, a bracket 20, a plurality of LED modules 30, a lamp cover 40, a pressing frame 60 and a protecting cage 50.

Figure 3:
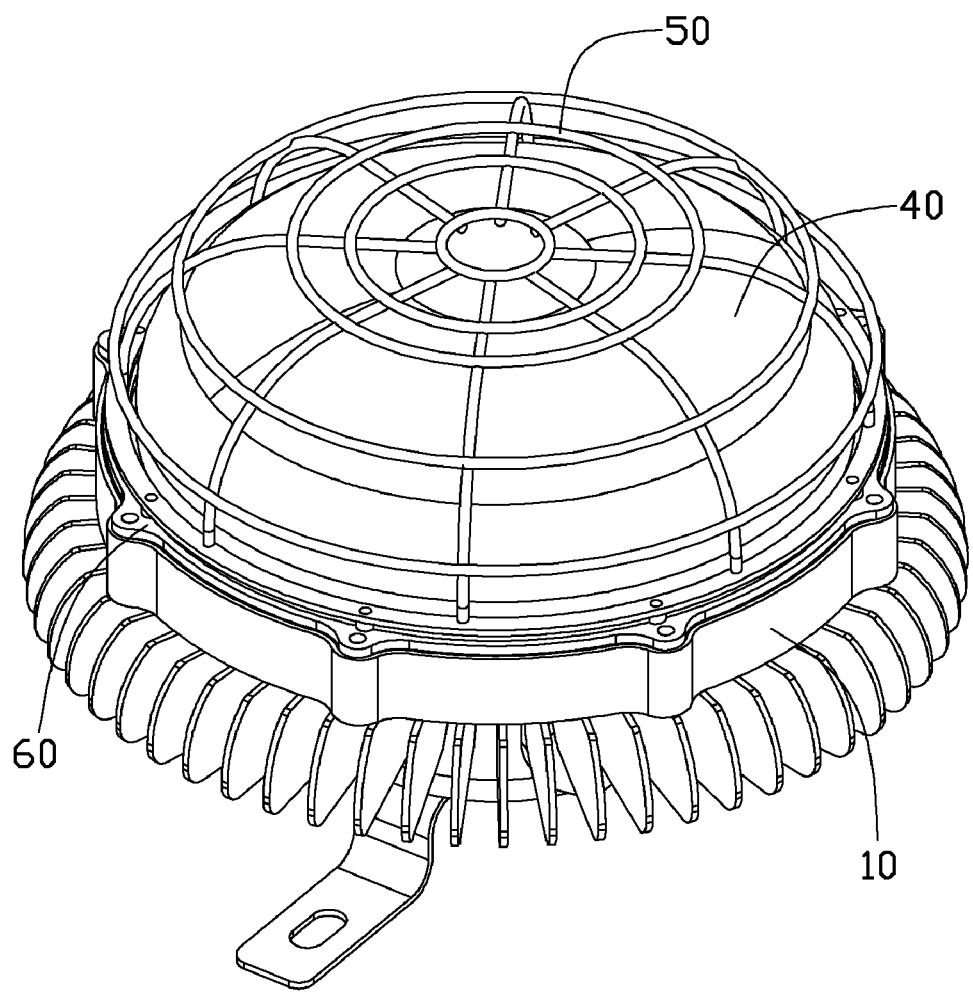
FIG. 3 is an inverted view of the light emitting diode lamp of FIG. 1.
Figure 4:
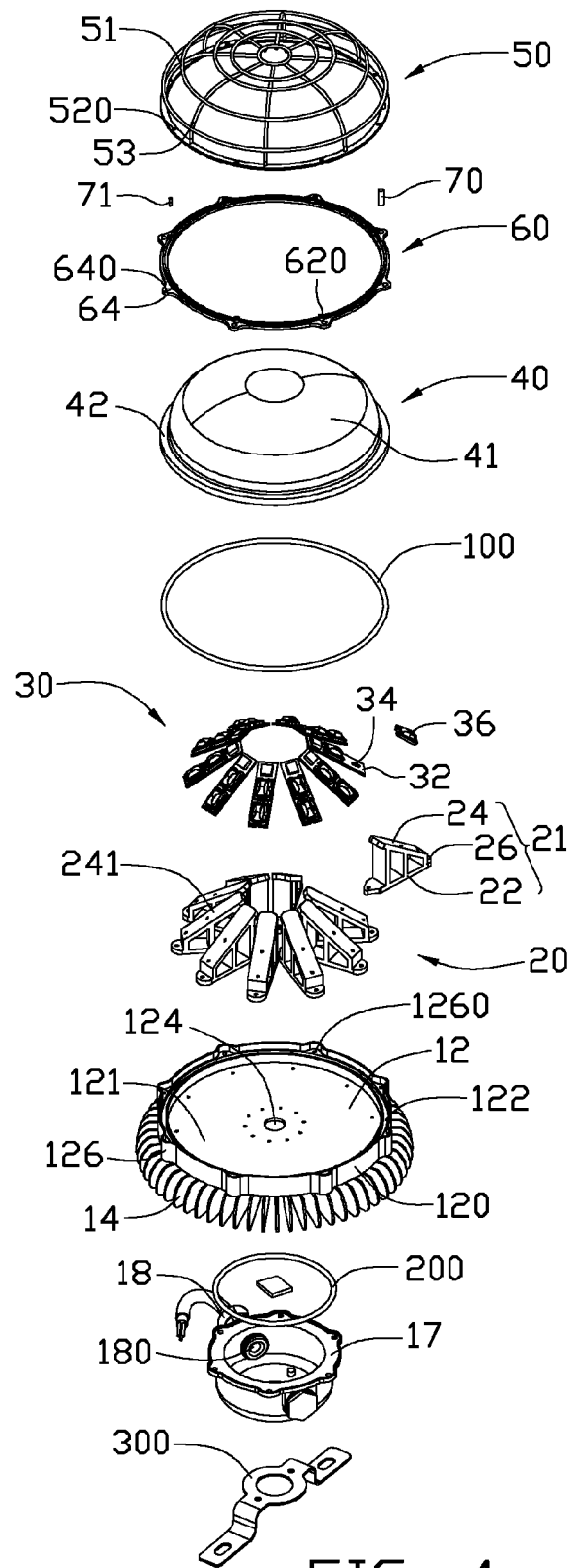
FIG. 4 is a view similar to FIG. 2, but viewed from a bottom aspect.

Referring to FIGS. 3-4 also, the heat sink 10 is integrally formed of a metal with good heat conductivity such as aluminum, copper or an alloy thereof. The heat sink 10 includes a circular supporting plate 12, an annular connecting wall 16 extending perpendicularly and upwardly from a central portion of a top surface of the supporting plate 12, a plurality of fins 14 arranged around the connecting wall 16 and an annular side wall 120 extending downwardly from an outer periphery of a bottom surface of the supporting plate 12. The side wall 120 and the supporting plate 12 cooperatively define a receiving room 121 for receiving the bracket 20 therein. An annular slot 122 concaves from a bottom surface of the side wall 120 towards the supporting plate 12 for receiving a first sealing ring 100 therein.

A through hole 124 extended through the top and bottom surfaces of the supporting plate 12 is defined in a center of the supporting plate 12. A plurality of protruding ribs 126 are formed on an outside surface of the side wall 120. The protruding ribs 126 are equally spaced from each other along a circumference direction of the side wall 120. Each of the protruding ribs 126 extends axially along a top-to-bottom direction of the side wall 120, and has a semicircular cross-section along a horizontal direction. A plurality of screw holes 1260 are defined in central portions of bottom ends of the protruding ribs 126, respectively. The fins 14 extend upwardly and perpendicularly from the top surface of the supporting plate 12, and extend radially outwardly from the connecting wall 16 beyond an outer periphery of the side wall 120. An air channel 141 is defined between each two neighboring fins 14. An annular groove 160 concaved from a top surface of the connecting wall 16 towards the supporting plate 12 is defined in a middle portion of the connecting wall 16. The annular groove 160 is for receiving a second sealing ring 200 therein.

Figure 5:
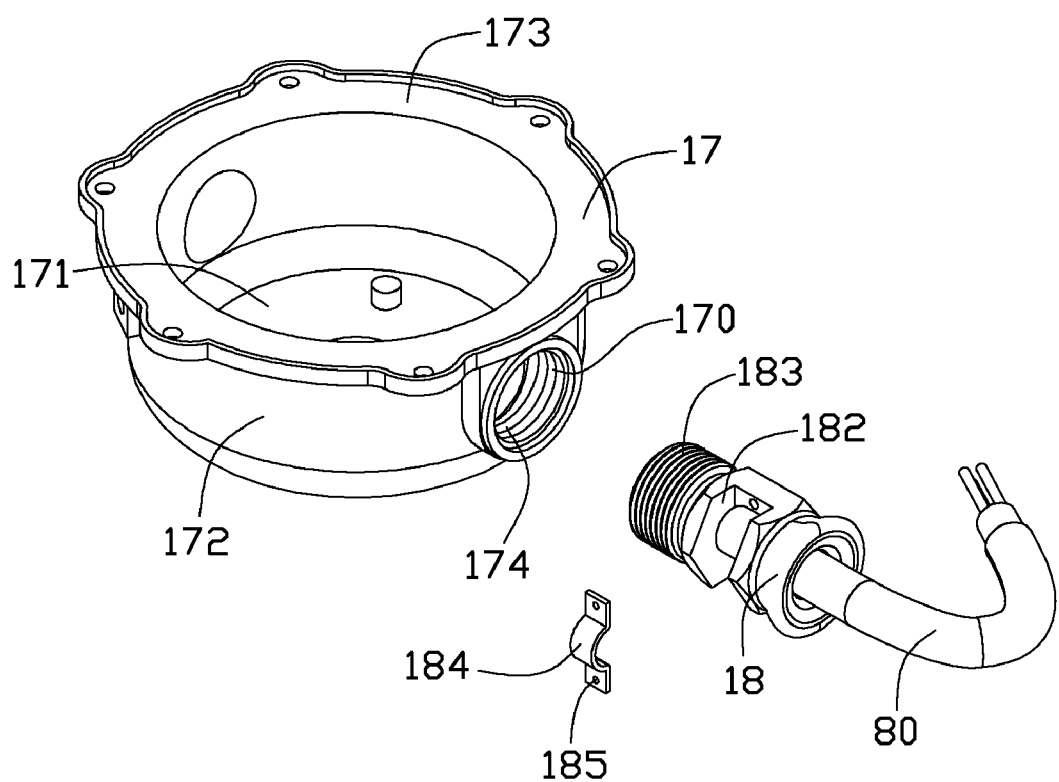
FIG. 5 is an isometric, exploded view of a mounting part of the light emitting diode lamp of FIG. 2.

A mounting part 17 is located on a top side of the heat sink 10 and a safety connector 18 is mounted to one side of the mounting part 17. Referring to FIG. 5, the mounting part 17 includes a circular top wall 171, a cylindrical sidewall 172 extending perpendicularly and downwardly from an outer periphery of the top wall 171 and a hem 173 extending perpendicularly and outwardly from a bottom end of the sidewall 172. The sidewall 172 has a diameter slightly smaller than that of the connecting wall 16 of the heat sink 10. When assembled, the mounting part 17 fixedly connects the heat sink 10 with the hem 173 contacting the top surface of the connecting wall 16; the mounting part 17 and the heat sink 10 cooperatively defines a space (not labeled) for receiving a driving module 400 therein. The second sealing ring 200 is received in the annular groove 160 and sandwiched between the hem 173 and the connecting wall 16 for eliminating a clearance therebetween, thus increasing a waterproof performance of the LED lamp. The driving module 400 provides electric power to the LED modules 30 via electric wires extended through the through hole 124 of the supporting plate 12 and electrically connected to the LED modules 30. A mounting hole 170 is defined in one side of the sidewall 172 of the mounting part 17. A plurality of inner screws 174 are formed on an inner surface of the mounting part 17 around the mounting hole 170.

The safety connector 18 is about tubular with a plurality of outer screws 183 formed on an outer surface of one end thereof adjacent to the mounting part 17. The outer screws 183 are screwed into the inner screws 174 for connecting the safety connector 18 and the mounting part 17 together. The safety connector 18 defines a central hole corresponding to the mounting hole 170 for extension of electrical wires 80 therethrough to be in electrical connection with the driving module 400 and an outer power source (not shown). A cutout 182 is defined in one side of the safety connector 18 for receiving a pressing piece 184 therein. The cutout 182 is recessed in the safety connector 18 such a depth that a portion of the electrical wires 80 in the safety connector 18 is exposed through the cutout 182. The pressing piece 184 is arced, and defines two fixing holes 185 at two opposite ends thereof. The pressing piece 184 is connected to the safety connector 18 via bolts (not shown) extended through the fixing holes 185 and inserted into the safety connector 18. The pressing piece 184 is mounted around the portion of the electrical wires 80 in the cutout 182 and tightly secures the electric wires 80 against an inner surface of the safety connector 18 in the cutout 182.

Referring back to FIG. 2, a fixing plate 300 is located on a top side of the mounting part 17. The fixing plate 300 is elongated, and includes an annular fixed portion 301 and two strip-shaped free portions 302 extending outwardly from two opposite sides of the fixed portion 301. Each of the free portions 302 defines a connecting hole 303 therein. The fixing plate 300 is tightly connected to the top wall 171 of the mounting part 17 via the fixed portion 301. When used, the LED lamp can be fixed to a wall or a ceiling via the free portions 302 of the fixing plate 300.

Referring to FIG. 4, the bracket 20 includes a plurality of supporters 21 radially placed on the bottom surface of the supporting plate 12. Inner ends of the supporters 21 sequentially adjoin with each other to enclose a zone around the through hole 124 of the supporting plate 12, and outer ends of the supporters 21 spacingly surround the zone. Each of the supporters 21 includes a horizontal top plate 22, an elongated, inclined bottom plate 24 spaced from the top plate 22 with a gradually increased distance along a radially inward direction and a plurality of connecting plates 26 connected between the top plate 22 and the bottom plate 24. A distance between the top plate 22 and the bottom plate 24 is gradually decreased from the inner end of the supporter 20 towards the outer end of the supporter 20. An acute intersection angle is accordingly formed between the top plate 22 and the bottom plate 24 at the outer end of the supporter 20.

When the supporters 21 are placed horizontally, the top plates 22 contact the bottom surface of the supporting plate 12, the intersection angle of the top plate 22 and the bottom plate 24 can be considered as an acute inclined angle of the bottom plate 24 relative to the bottom surface of the supporting plate 12. Each of the bottom plates 24 of the supporters 21 includes an outer surface 241 facing downwardly and outwardly, away from the supporting plate 12. The outer surfaces 241 of the bottom plates 24 are coplanar and located on a circumferential periphery of an imaginary cone. Each of the outer surfaces 241 of the bottom plates 24 has one of the LED modules 30 arranged thereon. The supporters 21 are made of materials having high heat conductivity, such as copper (Cu) or its alloys to timely transfer heat generated by the LED modules 30 to the heat sink 10 for dissipation.

Alternatively, the bracket 20 can be an integral structure having a plurality of bottom plates 24 inclined an acute angle relative to the bottom surface of the supporting plate 12. Fox example, the top plates 22 of the supporters 21 are integrated into a unitary circular plate, the bottom plates 24 protrude slantwise and downwardly from a circumference of the unitary circular plate.

Each of the LED modules 30 includes an elongated printed circuit board 32 and a plurality of LEDs 34 mounted on the printed circuit board 32. The printed circuit board 32 is mounted on the outer surface 241 of the bottom plate 24, and the LEDs 34 are arranged in a line along a lengthwise direction of the corresponding bottom plate 24. Each of the LEDs 34 is covered by a lens 36, whereby a light emitting angle of the LED 34 can be adjusted by the lens 36 to a suitable range.

The lamp cover 40 is integrally formed of a transparent or translucent material such as glass, resin or plastic. The lamp cover 40 includes a bowl shaped main body 41 defining an opening 43 (FIG. 2) at a top end thereof and a flange 42 extending outwardly from a periphery of the top end of the main body 41. The flange 42 has a shape and a size corresponding to the annular slot 122 of the side wall 120. When the lamp cover 40 is connected to the heat sink 10, the flange 42 is fixedly inserted into the annular slot 122, and the sealing ring 100 is sandwiched between the flange 42 and the bottom surface of the side wall 120 for eliminating a clearance therebetween, thus increasing the waterproof performance of the LED lamp. The lamp cover 40 and the side wall 120 of the heat sink 10 cooperatively receive the bracket 20 and the LED modules 30 therebetween.

The pressing frame 60 is annular shaped with a plurality of protruding tabs 64 extending radially and outwardly from an outer periphery thereof. The pressing frame 60 has an inner diameter substantially equaling to that of the flange 42 of the lamp cover 40, and an outer diameter substantially equaling to that of the side wall 120 of the heat sink 10. The protruding tabs 64 are equally distributed around the pressing frame 60 along a circumference direction thereof. Each of the protruding tabs 64 is about semi-circular shaped, and defines a hole 640 at a central portion thereof. The holes 640 of the protruding tabs 64 are corresponding to the screw holes 1260 of the protruding ribs 26, respectively. A plurality of fixing post (not labeled) are formed on an inner periphery of the pressing frame 60. Each of the fixing post defines a blind securing hole 620 therein.

The protecting cage 50 in whole has a shape corresponding to an outer shape of the lamp cover 40, and has a size slightly larger than the lamp cover 40. The protecting cage 50 includes a plurality of concentric metal rings 51 arranged along the top-to-bottom direction and a plurality of metal ribs 53 interconnecting the metal rings 51. In FIG. 4, diameters of the metal rings 51 are increased along the bottom-to-top direction. A plurality of apertures 520 are defined in a topmost metal ring 51 along a circumference direction thereof. The apertures 520 are corresponding to the securing holes 620 of the pressing frame 60, respectively.

When assembled, the bracket 20 is fixed to the bottom surface of the supporting plate 12 with the LED modules 30 located on the outer surface 241 of the bottom plates 24, respectively. The lamp cover 40 is hermetically connected to the side wall 120 of the heat sink 10 for defining a room for receiving the bracket 20 and the LED modules 30 therein. The pressing frame 60 is mounted around the lamp cover 40 and abut against a bottom of the flange 42 of the lamp cover 40. The protruding tabs 64 of the pressing frame 60 protrude outwardly beyond an outer periphery of the flange 42 and located just below the protruding ribs 126, respectively. Each of the holes 640 of the protruding tabs 64 is aligned with a corresponding screw hole 1260 of the protruding rib 126. Fasteners 70 (only one is illustrated in FIG. 4) are respectively extended through the holes 640 of the protruding tabs 64 and screwed into the screw holes 1260 of the protruding ribs 126 for connecting the lamp cover 40 and the heat sink 10 together. The protecting cage 50 covers on an outer surface of the lamp cover 40. The bottommost metal ring 51 of the protecting cage 50 is located just below the pressing frame 60 with the apertures 520 of the protecting cage 50 aligned with the securing holes 620 of the pressing frame 60, respectively. The protecting cage 50 and the pressing frame 60 are connected together via fasteners 71 (only one is illustrated in FIG. 4) extended through the apertures 520 of the bottommost ring 51 and inserted into the securing holes 620 of the pressing frame 60.

For the outer surfaces 241 of the bottom plates 24 of the supporters 21 are inclined with the acute angle relative to the bottom surface of the supporting plate 12, the LEDs 34 of the LED modules 30 located on the outer surfaces 241 of the bottom plates 24 of the supporters 21 are also inclined with the acute angle relative to the bottom surface of the supporting plate 12. It is known that a majority of light emitted from each of the LEDs 34 travels in a direction approximately perpendicular to a bottom surface thereof. Therefore, the majority of light emitted from each of the LEDs 34 travels in a direction approximately perpendicular to the outer surface 241 of the bottom plate 24 of the supporter 21. An angle of the majority of light relative to the bottom surface of the supporting plate 12 is supplementary to the acute angle of bottom plate 24 of the supporter 21 relative to the bottom surface of the supporting plate 12. A minority of light emitted from each of the LEDs 34 of the LED lamp radiates towards a central area of the LED lamp, whilst the majority of light emitted from each of the LEDs 34 of the LED lamp can radiate farther towards a periphery area around the LED lamp to increase a light emitting angle thereof. Furthermore, since the supporters 21 are made of material having high heat conductivity, heat generated by the LED modules 30 can be firstly conducted to the supporters 21 and then to the heat sink 10 quickly, which increases a heat dissipation area of the heat sink 10 to thereby ensure the LED modules 30 to work within a suitable temperature.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED lamp comprising:
   a heat sink comprising a supporting plate and a plurality of fins extending upwardly from a first surface of the supporting plate;
   a bracket mounted on a second surface of the supporting plate and comprising a plurality of bottom plates each angled an acute angle relative to the second surface of the supporting plate, the bottom plates arranged radially from a central portion of the supporting plate, each of the bottom plates comprising an outer surface facing downwardly and outwardly away from the second surface of the supporting plate; and
   a plurality of LED modules mounted on the outer surfaces of the bottom plates, respectively;
   wherein the supporting plate comprises an annular connecting wall extending upwardly from the first surface thereof, a mounting part connected with the connecting wall, the mounting part and the connecting wall cooperatively defining a space for receiving a driving module therein;
   wherein the mounting part comprises a top wall and a cylindrical sidewall extending from a periphery of the top wall, the sidewall defining a mounting hole at one side thereof, a safety connector being connected to the sidewall, the safety connector defining a central hole communicated with the mounting hole, the central hole of the safety connector and the mounting hole of the sidewall being configured for extension of electrical wires therethrough to be in electrical connection with the driving module and an outer power source.

2. The LED lamp as described in claim 1, wherein the bracket comprises a plurality of supporters horizontally and radially placed on the second surface of the supporting plate, each of the supporters comprising a top plate contacting the second surface of the supporting plate, each of the bottom plates extending slantwise and downwardly from an outer end of a corresponding top plate, inner ends of the supporters sequentially adjoined with each other to enclose a zone around a center of the supporting plate, outer ends of the supporters spacingly surrounding the zone, the acute angle being formed between the corresponding top plate and each of the bottom plates at the outer end of each supporter.

3. The LED lamp as described in claim 2, wherein a distance between each of the bottom plates and the corresponding top plate is decreased from the inner ends of the supporters towards the outer ends of the supporters.

4. The LED lamp as described in claim 2, wherein each of the supporters comprises a plurality of connecting plates connected between each of the bottom plates and the corresponding top plate.

5. The LED lamp as described in claim 1, wherein a plurality of inner screws are formed on an inner surface around the mounting hole, and a plurality of outer screws are formed on an outer surface of the safety connector, the outer screws screwed into the inner screws for connecting the safety connector and the mounting part together.

6. The LED lamp as described in claim 1, wherein the safety connector defines a cutout at one side for receiving a pressing piece therein, the pressing piece securing the electric wires against an inner surface of the safety connector.

7. The LED lamp as described in claim 1, wherein a through hole extended through the first and second surfaces is defined in the supporting plate, the through hole communicating with the central hole of the safety connector and the mounting hole of the sidewall for extension of the electrical wires therethrough to be in electrical connection with the driving module and the LED modules.

8. The LED lamp as described in claim 1, wherein the connecting wall defines an annular groove in a top surface along a circumference direction thereof, the mounting part comprising a hem contacted with the top surface of the connecting wall, a sealing ring received in the annular groove and sandwiched between the hem and the connecting wall for eliminating a clearance therebetween.

9. The LED lamp as described in claim 1, wherein a side wall extends downwardly from the second surface of the supporting plate, a lamp cover covered on the side wall and being connected to the heat sink, the lamp cover and the side wall cooperatively defining a room for receiving the bracket and the LED modules therein.

10. The LED lamp as described in claim 9, wherein a slot concaved from a bottom surface of the side wall towards the supporting plate is defined in the bottom surface of the side wall, the lamp cover comprising a bowl shaped main body defining an opening facing the heat sink and a flange extending outwardly from a periphery of the opening, the flange being fixedly inserted into the slot for connecting the lamp cover and the heat sink together.

11. The LED lamp as described in claim 10, further comprising a pressing frame mounted around the lamp cover and located below the flange, the pressing frame being annular shape with a plurality of protruding tabs extending outwardly beyond an outer periphery of the flange, each of the protruding tabs defining a securing hole therein, a plurality of protruding ribs corresponding to the protruding tabs being formed on the bottom surface of the side wall, each of the protruding ribs defining a screw hole therein, the securing holes being aligned with the screw holes, respectively, the pressing frame connected to the lamp cover via fasteners extending through the securing holes of the pressing frame and screwing into the screw holes of the protruding ribs of the side wall, respectively.

12. The LED lamp as described in claim 9, further comprising a protecting cage covered on an outer surface of the lamp cover, the protecting cage comprising a plurality of concentric rings arranged along a top-to-bottom direction thereof and a plurality of ribs interconnecting the rings, diameters of the rings being decreased along the top-to-bottom direction.

13. An LED lamp comprising:
- a heat sink comprising a supporting plate and a plurality of fins extending upwardly from a first surface of the supporting plate;
- a bracket mounted on a second surface of the supporting plate and comprising a plurality of bottom plates each angled an acute angle relative to the second surface of the supporting plate, the bottom plates arranged radially from a central portion of the supporting plate, each of the bottom plates comprising an outer surface facing downwardly and outwardly away from the second surface of the supporting plate; and
- a plurality of LED modules mounted on the outer surfaces of the bottom plates, respectively;
- wherein the supporting plate comprises an annular connecting wall extending upwardly from the first surface thereof, a mounting part connected with the connecting wall, the mounting part and the connecting wall cooperatively defining a space for receiving a driving module therein;
- wherein a through hole extended through the first and second surfaces is defined in the supporting plate, the through hole being configured for extension of electrical wires therethrough to be in electrical connection with the driving module and the LED modules.

14. An LED lamp comprising:
- a heat sink comprising a supporting plate and a plurality of fins extending upwardly from a first surface of the supporting plate;
- a bracket mounted on a second surface of the supporting plate and comprising a plurality of bottom plates each angled an acute angle relative to the second surface of the supporting plate, the bottom plates arranged radially from a central portion of the supporting plate, each of the bottom plates comprising an outer surface facing downwardly and outwardly away from the second surface of the supporting plate; and
- a plurality of LED modules mounted on the outer surfaces of the bottom plates, respectively;
- wherein a side wall extends downwardly from the second surface of the supporting plate, a lamp cover covered on the side wall and being connected to the heat sink, the lamp cover and the side wall cooperatively defining a room for receiving the bracket and the LED modules therein;
- wherein a slot concaved from a bottom surface of the side wall towards the supporting plate is defined in the bottom surface of the side wall, the lamp cover comprising a bowl shaped main body defining an opening facing the heat sink and a flange extending outwardly from a periphery of the opening, the flange being fixedly inserted into the slot for connecting the lamp cover and the heat sink together.

* * * * *